United States Patent [19]
Ajika et al.

[11] Patent Number: 5,378,643
[45] Date of Patent: Jan. 3, 1995

[54] ELECTRICALLY PROGRAMMABLE NON-VOLATILE SEMICONDUCTOR MEMORY DEVICE AND MANUFACTURING METHOD THEREOF

[75] Inventors: Natsuo Ajika; Hideaki Arima, both of Hyogo, Japan

[73] Assignee: Mitsubishi Denki Kabushiki Kaisha, Tokyo, Japan

[21] Appl. No.: 999,341

[22] Filed: Dec. 31, 1992

Related U.S. Application Data

[62] Division of Ser. No. 657,766, Feb. 21, 1991, Pat. No. 5,194,925.

[30] Foreign Application Priority Data

Feb. 22, 1990 [JP] Japan .................................. 2-43224

[51] Int. Cl.⁶ .......................................... H01L 21/265
[52] U.S. Cl. .......................................... 437/43; 437/49
[58] Field of Search ...................... 437/43, 48, 49, 52; 257/316

[56] References Cited

U.S. PATENT DOCUMENTS

| | | | |
|---|---|---|---|
| 4,618,876 | 10/1986 | Stewart et al. | |
| 4,989,054 | 1/1991 | Arima et al. | |
| 5,014,097 | 5/1991 | Kazerounian et al. | |
| 5,194,925 | 3/1993 | Ajika et al. | 257/314 |
| 5,215,933 | 6/1993 | Araki | 437/43 |
| 5,231,041 | 7/1993 | Arima et al. | 437/43 |

FOREIGN PATENT DOCUMENTS

| | | |
|---|---|---|
| 55-46502 | 4/1980 | Japan . |
| 61-181168 | 8/1986 | Japan . |
| 61-216482 | 9/1986 | Japan . |

OTHER PUBLICATIONS

Inoue et al, "A New Stacked Capacitor Cell with Thin Box Structured Storage Node", *Extended Abstract of the 21st Conference on Solid State Devices and Materials* (1989), pp. 141–144.

Primary Examiner—George Fourson
Assistant Examiner—Richard A. Booth
Attorney, Agent, or Firm—Lowe, Price, LeBlanc & Becker

[57] ABSTRACT

An A-1 transistor type flash EEPROM is disclosed. The memory cell in the EEPROM comprises: a first control gate which is formed, through a first insulating film, on a first channel region formed between a source region and a drain region. A floating gate is formed on the second channel region through a second insulating film and on the first control gate through the first interlayer insulating film. A second control gate is formed on a surface of the floating gate through a second interlayer insulating film. One end of the second control gate and one end of the first control gate are electrically connected to each other through a third control gate, thereby enhancing capacitance between the control gates and the floating gate.

1 Claim, 11 Drawing Sheets

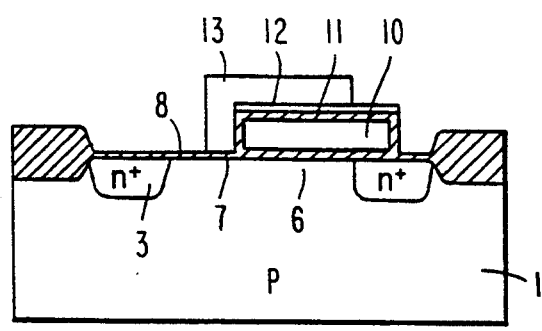
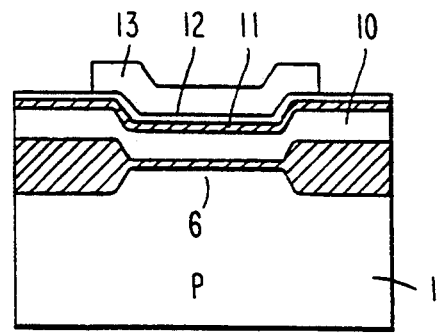
Fig. 8(a)　　　　　　　Fig. 8(b)
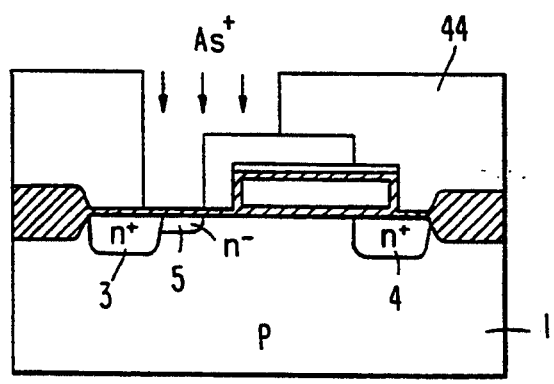
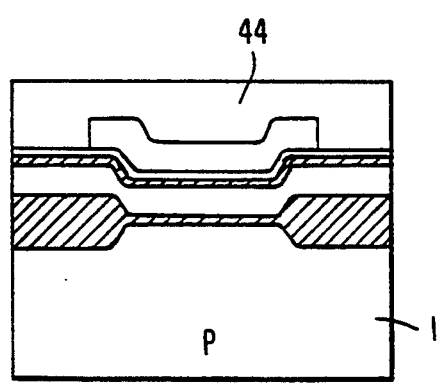
Fig. 9(a)　　　　　　　Fig. 9(b)

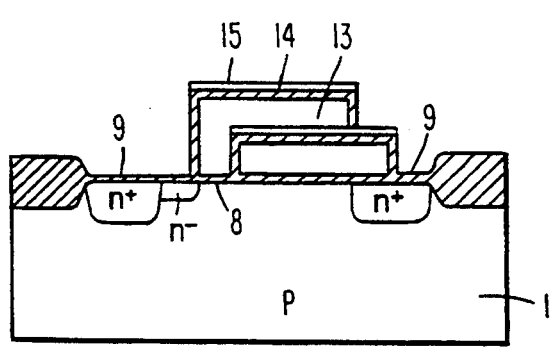
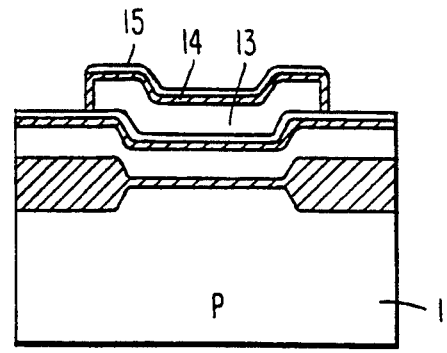
Fig. 10(a)    Fig. 10(b)
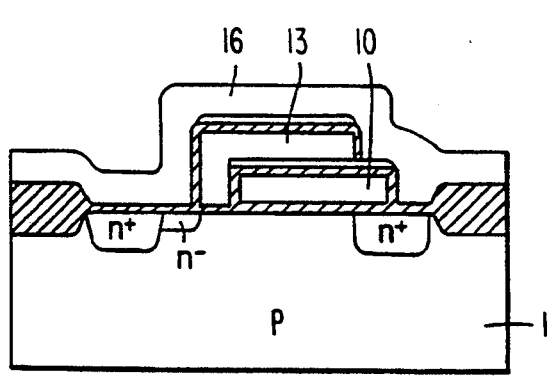
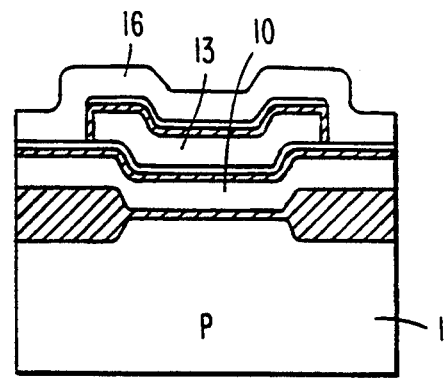
Fig. 11(a)    Fig. 11(b)
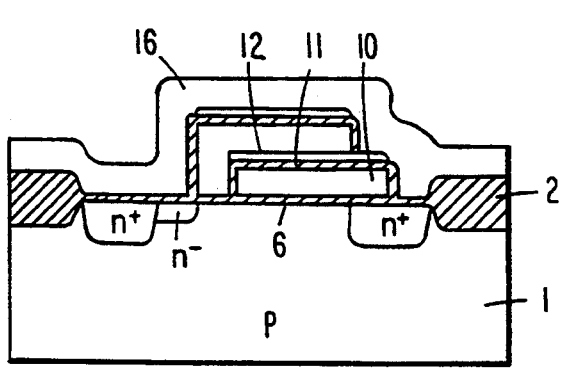
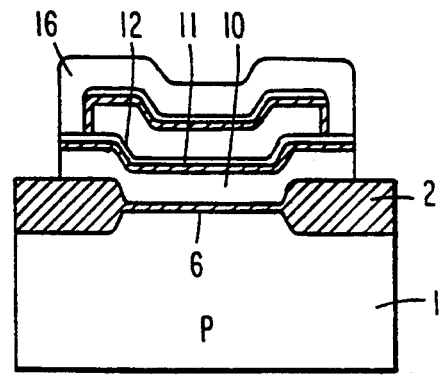
Fig. 12(a)    Fig. 12(b)

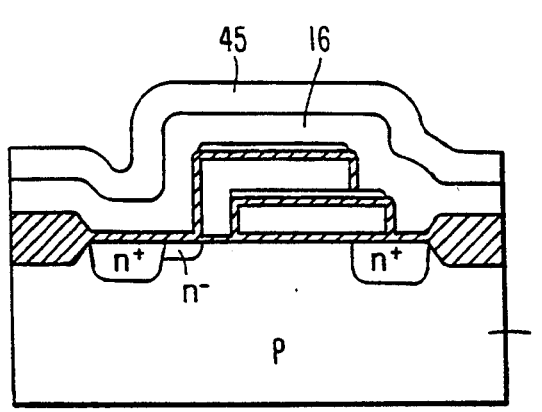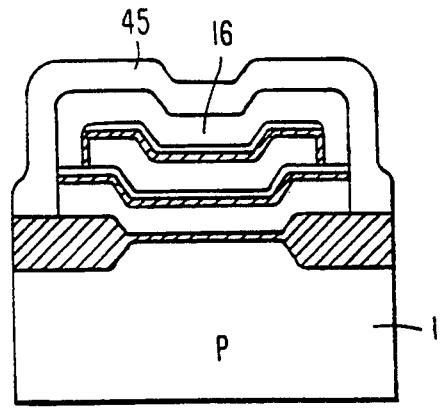
Fig. 13(a)  Fig. 13(b)
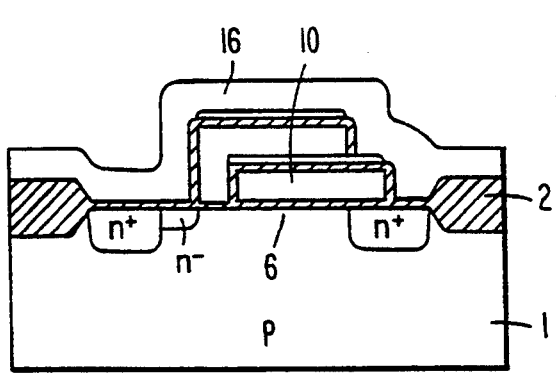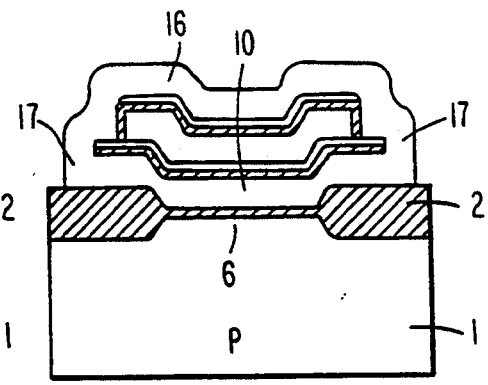
Fig. 14(a)  Fig. 14(b)
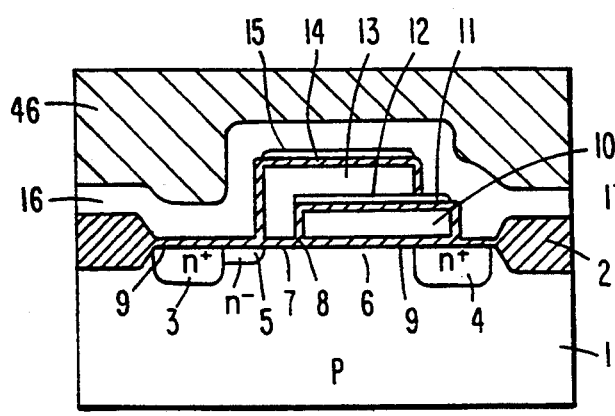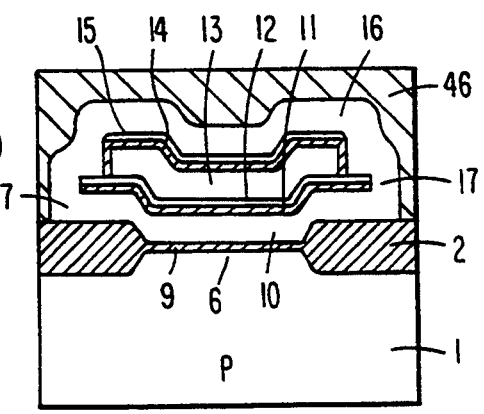
Fig. 15(a)  Fig. 15(b)

ELECTRICALLY PROGRAMMABLE NON-VOLATILE SEMICONDUCTOR MEMORY DEVICE AND MANUFACTURING METHOD THEREOF

This application is a divsional of U.S. application Ser. No. 07/657,766, filed Feb. 21, 1991, now U.S. Pat. No. 5,194,925.

FIELD OF THE INVENTION

The present invention relates to an electrically programmable non-volatile semiconductor memory device and, more particularly, to a flash type non-volatile semiconductor memory device.

FIG. 21 shows an entire arrangement of a conventional non-volatile semiconductor memory device (hereinafter referred to as "EEPROM"). As illustrated in the drawing, the EEPROM comprises a memory cell array 40 in which a plurality of memory cells are disposed on a matrix; an X decoder which receives a row address signal from outside and activates a word line connected to a specific memory cell among the memory cell array 40; and a Y decoder which receives a column address signal from outside and activates a Y gate 23 which connects a bit line connected to a specific memory cell to an input-output circuit 25. Data signals stored in the memory cell selected by the X decoder and Y decoder are fetched out of the EEPROM through the Y gate 23 and the input-output circuit 25. The mentioned EEPROM further comprises a control circuit 24 for supplying peripheral circuits of the memory cell array 40 with a control signal. The EEPROM provided with the mentioned circuits is disposed on a single semiconductor substrate 26 and has two power terminals. One of the two terminals is a power input terminal (VCC) 18, and the other is a high voltage power input terminal (VPP) 39.

The memory cell employed herein is a semiconductor memory device in which data are electrically written and erased. FIG. 20 shows a sectional view of an arrangement of the memory cell. As illustrated in the drawing, formed on a P type silicon substrate 1 are a field oxide film 2 serving as a device separation region, and n+ type drain region 3 formed into an island-shaped region separated by the mentioned field oxide film 2, and an n+ type source region 4. A channel region 33 is formed between the n+ drain region 3 and the n+ source region 4. A floating gate 35 is formed on the channel region 33 through a gate oxide film 34. Formed on the floating gate 35 are an interlayer oxide film 36 and an interlayer nitrade film 37, and a control gate 38 is further formed thereon. Furthermore, the entire arrangement is coated with a PSG film 46.

Described hereinafter is operation of the EEPROM arranged as mentioned above.

For writing data in the memory cell, fist 12.5V are applied to the high voltage power input terminal (VPP) 39, form which the 12.5V are supplied to the control gate 38, while 8V is supplied to the n+ type drain region 3 by way of a load resistance. On the other hand, the n+ type source region 4 serves as a ground potential (GND). At this time, electrons move from the n+ drain region 3, thus a current of about 0.5 to 1 mA flows in the channel 33. Electrons flowing at this time are accelerated by an electric field in the vicinity of the n+drain region 3, whereby a high energy is obtained exceeding 3.2 eV which is an energy barrier between the surface of the P type silicon semiconductor substrate 1 and the gate oxide film 34. The electrons having obtained such a high energy are called "hot electrons", and a part of these hot electrons is conducted by a high potential (12.5 V) of the control gate 38 over the barrier of the gate oxide film 34, then injected in the floating gate 35. As a result of this, the floating gate 35 goes into an electrically negative slate, and this state corresponds to "0" of the data.

For erasing data from the memory cell, first in the same manner as writing, 12.5V are applied to the high voltage source input terminal (VPP) 39, from which the 12.5V are supplied to the n+ source region 4. On the other hand, the control gate 38 serves as a ground potential (GND), while the n+ type drain region 3 is put into a floating state. At this time, a high electric field is generated in the gate oxide film 34 between the floating gate 35 and the n+ type source region 4, thereby reducing the energy barrier on the gate oxide film 34, and discharging the electrons being conducted from the floating gate 35 to the high potential (12.5V) of the n+ type source region 4. As a result of this, a current called "tunnel current" passes between the floating gate 35 and the n+ type source region 4. Because this current comes only from the electric charge accumulated in the floating gate 35, it is a very small current in the order of μA. In this manner, the floating gate 35 goes into an electrically neutral state without electric charge, and this state corresponds to "1" of the data.

In the EEPROM according to the prior art, for the writing of data in the memory cell, injection of hot electrons into the floating gate 35 has been generally utilized, and the saturation amount of the hot electrons injected depends upon a potential VF of the floating gate 35 calculated by the following expression:

$$VF = (C2\ VC + C3\ VD)/(C1 + C2 + C3)$$

where
C1: capacitance between the floating gate 35 and the semiconductor substrate 1;
C2: capacitance between the floating gate 35 and the control gate 38;
C3: capacitance between the floating gate 35 and the drain region 3;
VC: potential supplied to the control gate 38; and
VC: potential supplied to the drain region 3.

For writing data in the memory cell shown in FIG. 20, 12.5V are supplied to the control gate 38 while 8V is supplied to the n+ drain region 3, thus the potential VF of the floating gate 35 comes to be about 5V. When this potential VF of the floating gate 35 is about 5V as mentioned, the current flowing out of the floating gate 35 as a result of injection of the hot electrons is smaller than the current flowing in the channel region 33. As a current of several mA is necessary to be supplied from the floating gate 35 for writing the data, the channel 13 requires a current of tens of mA. However, any circuit capable of supplying such a current as tens of mA requires a large area and is difficult to form on the semiconductor chip 26. Hence, in order to secure a current necessary for writing the data, the high potential to be supplied to the control gate 38 and n drain region 3 is obliged to be directly supplied from the high voltage power terminal (VPP) 39 formed on the semiconductor chip 26 as shown in FIG. 21. As a result, a serious problem exists in that, for arranging a system on a printed board utilizing a flash type EEPROM provided with two power sources for the power input terminal (VCC) 18 and high voltage power input terminal (VCC) 39, design and manufacture of the peripheral portion of the power terminals becomes unavoidably complicated, and the operation of rewriting a program and data, and incorporating them within the system is very difficult, resulting in it being very hard to use the system after all.

Moreover, in the writing of data in the memory cell, a part of the hot electrons is accelerated by a high electric field in the vicinity of the n+ type drain region 3 and having obtained high energy, brings about ionization by collision with grids of silicon, thereby generating a large number of electron hole pairs.

It is certain that most of the generated electrons flow into the n+ type drain region 3, and that the remaining part of electrons, called the "avalanche hot carrier," is conducted by the high potential of the control gate 38 and injected into the gate oxide film 34, even if the avalanche hot carrier has no energy superior to the energy barrier of the gate oxide film 34. The electrons thus injected are trapped little by little to reach a trap level. It is to be noted that there are two types of traps, i.e., one is electrically positive and the other is electrically neutral. Accordingly, when the electrons are trapped by the positive trap, they become electrically neutral, and when trapped by the neutral trap, an electrically negative charge is generated. In this manner, as compared with the initial state when electrons have not yet been trapped, the electric charge in the gate oxide film 34 after having trapped the electrons is directed to negative, and threshold voltage is increased to the level of deteriorating the gate oxide electrode 34.

On the other hand, most of the generated holes flow through the p type silicon semiconductor substrate 1 to serve as a substrate current, but the remaining part of the holes, called the avalanche hot carrier in the same way as the foregoing electrons, is injected into the gate oxide film 34. The holes thus injected generate a boundary level when passing through the boundary between the P type silicon semiconductor substrate 1 and the gate oxide film 34, thereby reducing mutual inductance. Furthermore, when the electrons are trapped by this boundary level and thereby further increase the negative charge and threshold voltage, the deterioration of the gate oxide film 34 becomes serious all the more and, finally, normal operation as a memory cell is not performed. Thus, the memory cell is destroyed. Moreover, in the conventional flash type EEPROM arranged as mentioned above, another serious problem arises in that, since the gate oxide film 34 is deteriorated to the extent of occurrence of the above noted destruction, the number of times allowed for rewriting data in the memory cell is limited to $10^2$ to $10^3$ eventually making the use of the system very restrictive.

SUMMARY OF THE INVENTION

An object of the present invention is, therefore, to provide a non-volatile semiconductor memory device and a manufacturing method thereof in which the number of times allowed for rewriting data is increased.

Another object of the invention is to provide a non-volatile semiconductor memory device capable of being operated by a single power source.

To accomplish the foregoing objects, the semiconductor memory device in accordance with the invention comprises:

a first control gate portion which is formed, through a first insulating film, on a first channel region formed between a source region and a drain region;

a floating gate which is formed on a second channel region through a second insulating film and on the first control gate through a first interlayer insulating film;

a second control gate portion which is formed on a surface of said floating gate through a second interlayer insulating film; and a third control gate portion which is connected to one end of the second control gate portion and to one end of the first control gate portion and formed, through an insulating film, opposite to one end of the floating gate and orthogonal with the first and second channel regions.

Then, the manufacturing method of a semiconductor memory device in accordance with the invention comprises the steps of:

forming a source region of second conduction type and a drain region of second conduction type on one main surface of a semiconductor substrate of first conduction type through first and second channel regions;

forming a first control gate portion, through a first insulating film, on the first channel region;

forming a floating gate on a second insulating film of the second channel region and on a first interlayer insulating film of the first control gate;

forming a second control gate portion opposite to the surface of said floating gate through a second interlayer insulating film; and forming a third control gate portion which connects one end of the second control gate portion orthogonal with the first and second channel regions to one end of the first control gate portion orthogonal with the first and second channel regions.

In the semiconductor memory device of the above arrangement, since the respective control gates serving as the first to third control gates are opposed to at least one of the front surface, back surface and one end face, a larger capacitance coupling is achieved between the control gate and floating gate, thereby enhancing the potential of the floating gate at the time of writing data.

Then in the manufacturing method of a semiconductor memory device according to the above steps, since the first control gate, the floating gate and the second control gate are formed by sequentially laminating the gates in order and further the third control gate is formed to connect one end of the first and second channel regions of the first and second control gates which is orthogonal with the first and second channel regions, the invention exhibits an advantage of making it possible to put the floating gate between the electrically connected first and second control gates without complicated process.

DESCRIPTION OF THE PREFERRED EMBODIMENT

The present invention is hereinafter described with reference to FIG. 1.

Figure 1A:
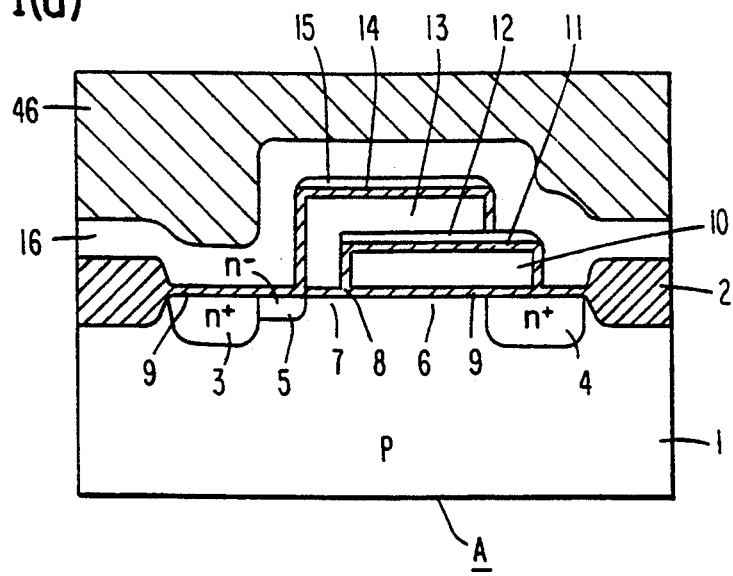
FIGS. 1(a)-1(c) are a structural sectional view showing one embodiment in accordance with the present invention, a side sectional view and an equivalent circuit diagram thereof.

FIG. 1(a) shows an arrangement of the semiconductor memory device in accordance with the invention.

To be more specific, one main surface of the p type silicon is divided into the respective memory cell regions by the field oxide film 2, and the n+ type drain region 3 and the n+ type source region 4 are formed in the mentioned field oxide film 2 respectively in such a manner as to separate from each other. An n− type drain region 5 is formed adjacent the mentioned n+ drain region 3. This n− type drain region 5 is formed by arsenic ion implantation. A first channel region 6 and a second channel region 7 are formed between the mentioned n+ type source region 4 and n− type drain region 5. The first channel region 6 is adjacent the mentioned n+ type source region 4, and the second channel region 7 is adjacent the mentioned n− type drain region 5. A tunnel oxide film 8 is formed on the second channel region 7. A thermal oxide film 9 is formed on the surface other than the second channel region 7 of the substrate 1. A first layer 10 of the control gate is formed on the first channel region 6 through the mentioned thermal oxide film 9. A part of this first layer 10 of the control gate is superposed on a part of the mentioned n+ type source region 4 through said thermal oxide film 9. The upper surface and side surfaces of the first layer of the control gate is coated with an interlayer oxide film 11. An interlayer nitride film 12 is formed on the interlayer oxide film 11. A floating gate 13 is formed on said second channel region 7 through the mentioned tunnel oxide film 8. A part of this floating gate 13 is formed on the first layer 10 of the control gate through the interlayer oxide film 11 and the interlayer nitride film 12. An interlayer oxide film 14 is formed on the upper surface and side surfaces of the floating gate 13. An interlayer nitride film 15 is formed on the interlayer oxide film 14. A second layer 16 of the control gate is formed on the surface of the floating gate 13 through the mentioned interlayer oxide film 14 and interlayer nitride film 15. Further formed on the side surfaces of the floating gate 13 is a third layer 17 which connects electrically the first layer 10 of the control gate to the second layer 16 thereof.

Figure 20:
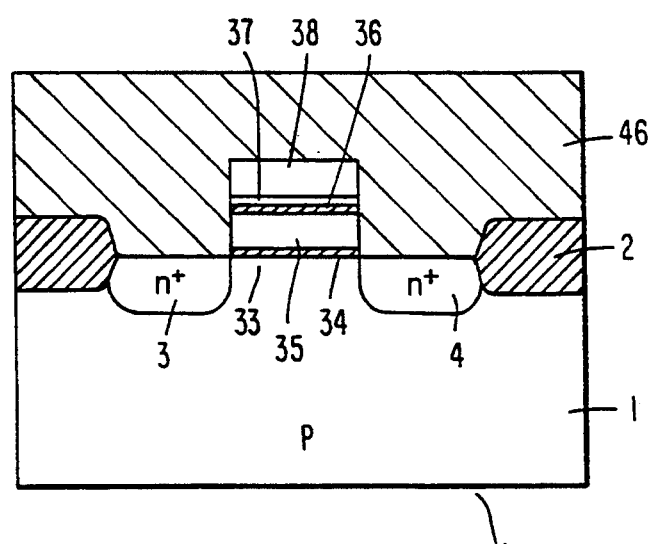
FIG. 20 is a structural sectional view of a memory in accordance with the prior art.
Figure 21:
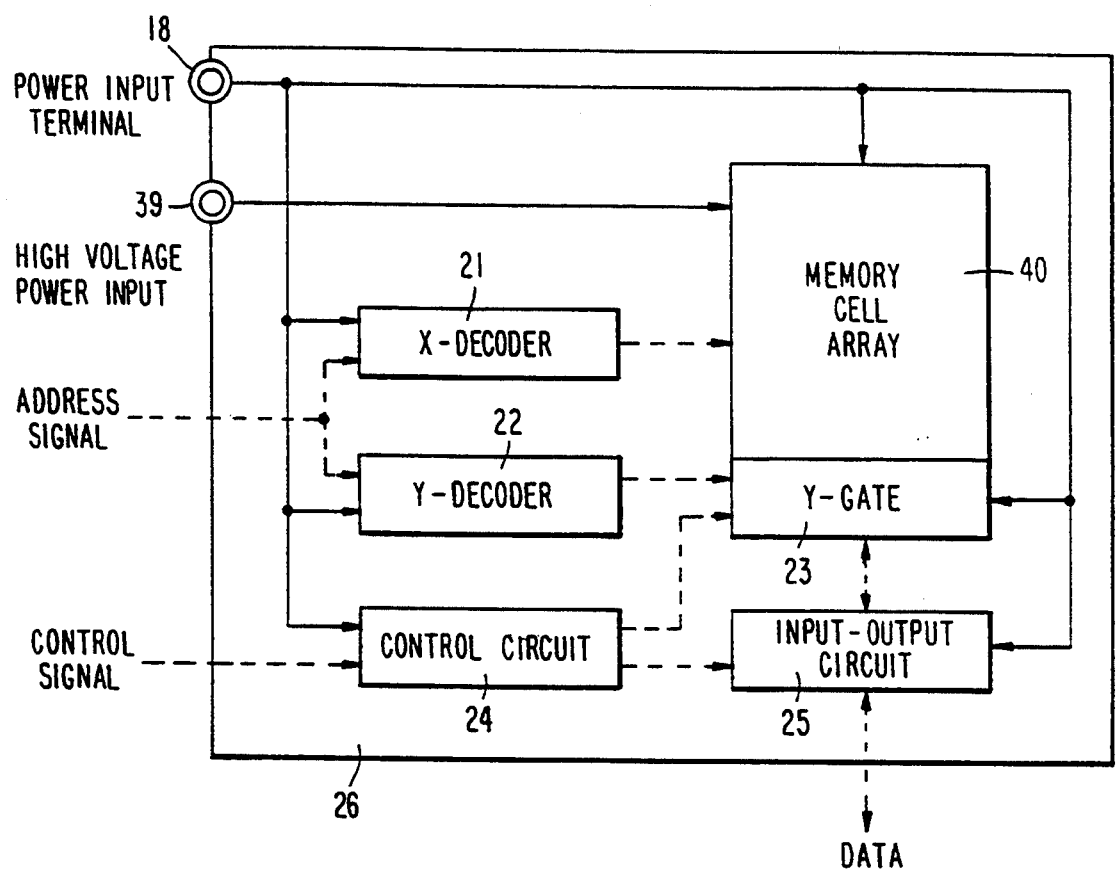
FIG. 21 is a block diagram showing an embodiment of the EEPROM provided with the memory cell shown in FIG. 20.

In the memory cell of the above arrangement, as compared with the conventional memory cell shown in FIG. 20, the area disposed between the floating gate 13 and the control gates 10, 16, 17 is large while the area disposed between the floating gate 13 and the semiconductor substrate 1 is small. As a result, in the memory cell of this embodiment in accordance with the invention, the capacitance C2 between the floating gate 13 and the control gates 10, 16, 17 becomes larger than in the conventional memory cell, while the capacitance C1 between the floating gate 13 and the semiconductor substrate 1 becomes smaller than normal. Accordingly, capacitance coupling from the control gates 10, 16, 17 to the floating gate 13 can be made larger, thereby permitting the potential VF of the floating gate 13 to be enhanced at the time of writing data.

In this manner, for writing data in the memory cell, a high voltage (15V) is supplied to the control gates 10, 16, 17 and when the n+ type drain region 3 and n+ type source region 4 are grounded and reach the ground potential (GND), the potential VF of the floating gate 13 is about 10V, whereby electrons move from the n+ type drain region 3 toward the floating gate 13 by way of the n-type drain region 5, thus causing a current to flow in the second channel region 7. A high electric field is generated in the tunnel oxide film 8 formed between the floating gate 13 and the second channel region 7, the energy barrier of the tunnel oxide film 8 is reduced. The electrons moved to the second channel region 7 are conducted by the high potential (15V) of the control gates 10, 16, 17 over the reduced energy barrier and injected into the floating gate 13, thereby causing the floating gate 13 to be electrically negative. A tunnel current ($\mu$A) flows between the floating gate 13 and the n+ drain region 3. As this tunnel current depends upon the electric charge accumulated in the floating gate 13 alone, a very small current of more or less $\mu$A is sufficient. On the other hand, there is no current flowing in the first channel region 6.

For erasing data from the memory cell, when a high voltage (15V) is supplied to the n+ drain region 3 and the control gates 10, 16, 17 are grounded to reach the ground potential (GND) and the n+ type source region 4 goes into a state of floating, a high electric field is generated in the tunnel oxide film 8 between the floating gate 13 and the second channel region 7, and the energy barrier of the tunnel oxide film 8 is reduced in the same manner as in the aforesaid writing. The electrons accumulated in the floating gate 13 are conducted by the high potential (15V) of the n+ type drain region 3 over the reduced energy barrier and discharged into the second channel region 7, thereby causing the floating gate 13 to be electrically neutral. The electrons discharged into the second channel region 7 move toward the n+ type drain region 3 by way of the n− drain region 5, whereby the tunnel current ($\mu$A) flows between the floating gate 13 and the n+ drain region 3. As this tunnel current depends upon the electric charge accumulated in the floating gate 13 alone, it is a very small current in the order of $\mu$A. On the other hand, there is no current flowing in the first channel region 6. That is, since the tunnel current is utilized to inject the electrons in "the floating gate 13 for writing data in the memory cell in the same manner as the erasing, a small current of about $\mu$A flows in the second channel 7. Since there is no electron moving from the n+ type drain region 3 toward the n+ source region 4, no ionization collision occurs with silicon grids in the first channel region 6 and second channel region 7.

Accordingly, no avalanche hot carrier is generated, and deterioration of the tunnel oxide film is prevented thereby maintaining a stable state. As a result, the number of times for rewriting data in the memory cell is improved to $10^4$ to $10^5$ thus an EEPROM which is easy to use is achieved.

A manufacturing method of the semiconductor memory device of above arrangement is hereinafter described with reference to FIGS. 2 to 15.

Figures 2A, 2B:
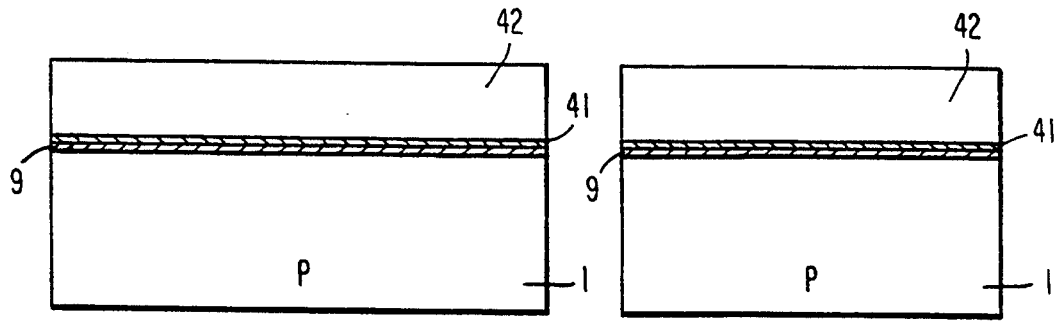
FIG. 2(a), 2(b), 3(a), 3(b), 4(a), (4(b),5(a), 5(b), 6(a), 6(b), 7(a), 7(b), 8(a), 8(b), 9(a), 9(b), 10(a), 10(b), 11(a), 11(b), 12(a), 12(b), 13(a), 13(b), 14(a), 14(b), 15(a) and 15(b) are sectional views showing sequentially the manufacturing of the embodiment shown in FIG. 1, and side sectional views thereof.

First, as illustrated in FIG. 2, a thermal oxide film 9 of 300Å in thickness, a silicon nitride film 41 and a resist 42 are laminated sequentially in order on the entire one main surface of a P type silicon semiconductor substrate 1 of $1^{15} \times 10^{-3}$ cm in concentration and 10 Ω·cm in resistivity.

Figures 3A, 3B:
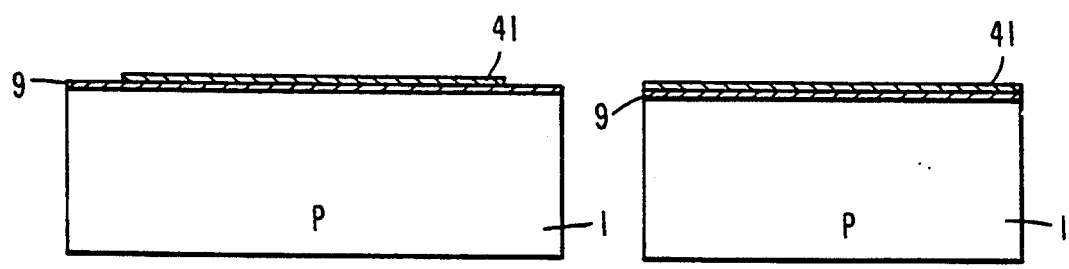

Then, as illustrated in FIG. 3, a resist 42 is subject to patterning by photo-etching in such a manner as to leave the pattern of the resist 42 on the region where the device is to be formed. Subsequently, patterning of the silicon nitride film 41 is performed using the pattern of the resist 42. The pattern of the resist 42 is thereafter removed.

Figures 4A, 4B:
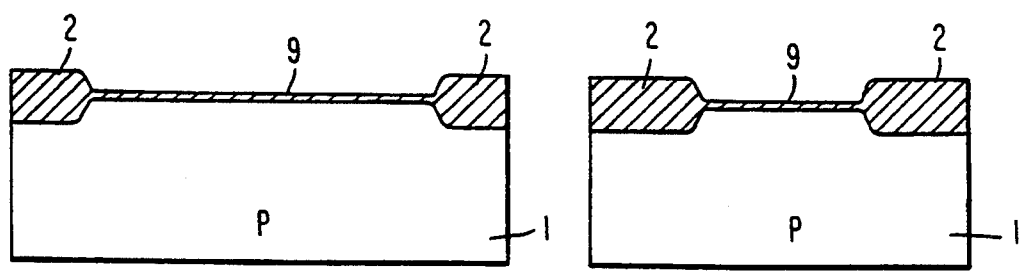

Then, as illustrated in FIG. 4, the main surface of the p type silicon semiconductor substrate 1 is selectively oxidized using the patterned silicon nitride film 41 as a mask, whereby the field oxide film 2 is formed. The silicon nitride film 41 is thereafter removed.

Figures 5A, 5B:
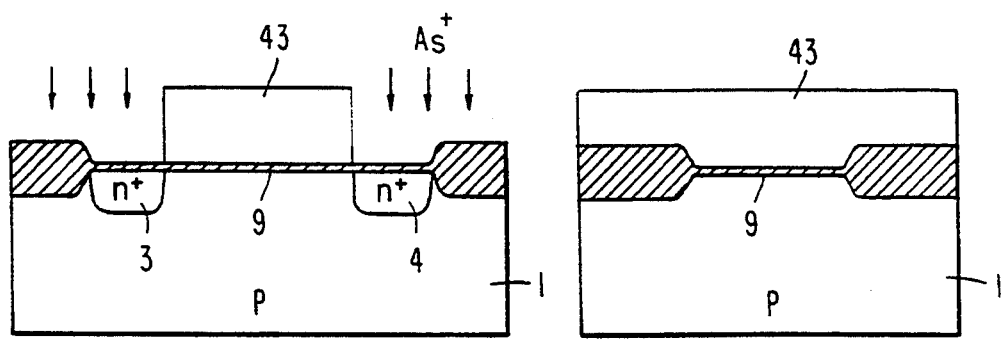

Then, as illustrated in FIG. 5, the pattern of a resist 43 is formed on the thermal oxide film 9 other than the part where the source region and the drain region are to be formed. Subsequently, arsenic ion implantation is performed on one main surface of the p type silicon semiconductor substrate 1 using the pattern of the resist 43 as a mask and conditions of 30 to 40 KeV in acceleration voltage and $4 \times 10^{15}$ cm$^{-2}$ in dosage, whereby the n+ type drain region 3 and the n+ source region 4 of $1 \times 10^{20}$ cm$^{-3}$ are formed. The pattern of the resist 43 is thereafter removed.

Figures 6A, 6B:
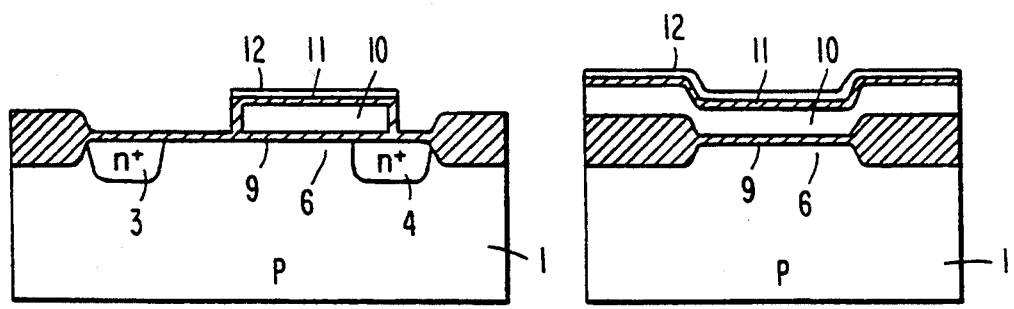

Then, as illustrated in FIG. 6, a polycrystalline silicon layer is formed on the entire one main surface of the P type silicon semiconductor substrate 1 by the CVD method, and the first layer 10 of the control gate is formed by performing an etching in a direction orthogonal with a direction of joining the n+ type drain region 3 and the n+ type source region 4, in such a manner that a part of the polycrystalline silicon may be left on a part of the n+ source region 4 through the thermal oxide film. 9. Subsequently, the interlayer oxide film 11 is formed on the surface of the first layer 10 of the control gate and the side surfaces in a direction orthogonal with a direction of joining the n+ type drain region 3 and the n+ type source region 4, and further the interlayer nitride film 12 is formed on the upper surface of the mentioned interlayer oxide film 11. It is established herein that the first channel 6 is a region right under the first layer 10 of the control gate between the n$^{30}$ type drain region 3 and the n+ source region 4.

Figures 7A, 7B:
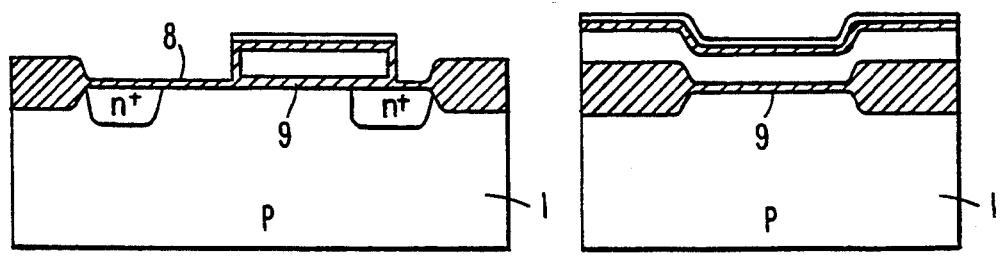

Then, as illustrated in FIG. 7, a region of the thermal oxide film 9, other than the region where first layer 10 of the control gate is formed, is subject to etching to form the funnel oxide film 8 of 100A in thickness.

Then, as illustrated in FIG. 8, a polycrystalline silicon layer is formed on the entire one main surface of the P type silicon semiconductor substrate 1 by the CVD method. Subsequently, etching is applied to the polycrystalline silicon layer in such a manner that one end thereof may be adjacent the tunnel oxide film 8 right above the first channel region 6 and the n+ type drain region 3 and be left on a side surface portion of the n+ drain region 3 on the side orthogonal with the first channel region 6 of the first layer 10 of the control gate through the interlayer oxide film 11. The etching is performed also in such a manner as to leave the mentioned one end being opposed to a predetermined region on the surface of the first layer 10 of the control gate through the interlayer oxide film 11 and interlayer nitride film 12. It is established herein that a region right under floating gate 13 between the n+ drain region 3 and the first channel region 6 is the second channel region 7 adjacent the first channel region 6.

Then, as illustrated in FIG. 9, a pattern of resist 44 is formed on one main surface of the P type silicon semiconductor substrate 1 other than in the region where a drain region of low concentration is to be formed. Subsequently, arsenic ion is implanted in the one main surface of the P type silicon semiconductor substrate 1 using the pattern of the resist 44 as a mask and conditions of 150 KeV in acceleration voltage and $5 \times 10^{14}$ cm$^{-2}$ in dosage, whereby the n− type drain region 5 of $1 \times 10^{19}$ cm$^{-3}$ in concentration is formed. This n− type drain region 5 inhibits leak current around the n+ type region 3 and is effective for the electron injection using the tunnel current. The pattern of the resist 44 is thereafter removed.

Then, as illustrated in FIG. 10, the thermal oxide film 9 is again formed on a region of the tunnel oxide film 8 other than in the region where floating gate 13 is formed, and an interlayer oxide film 14 is formed on the upper surface and every side surface of the floating gate 13. Further, an interlayer nitride film 15 is formed on the upper surface of the mentioned interlayer oxide film 14.

Then, as illustrated in FIG. 11, a polycrystalline silicon layer which will be a second layer 16 of the control gate is formed by the CVD method on one main surface of the P type silicon semiconductor substrate.

Then, as illustrated in FIG. 12, etching is applied simultaneously to the first layer 10 and second layer 16 of the control gate in a direction parallel to the first channel region 6 on the field oxide film 2, in such a manner that a part of the second layer 16 of the control gate superposed on the first layer 10 of the control gate may be left through the interlayer oxide film 11 and interlayer nitride film 12.

Then, as illustrated in FIG. 13, a polycrystalline silicon layer 45 is formed by the CVD method on the entire one main surface of the P type semiconductor substrate 1.

Then, as illustrated in FIG. 14, etching is applied to the polycrystalline silicon layer 45 to form a side wall 17 of the control gate in such a manner that two ends in parallel to the first channel region 6 of polycrystalline silicon layer 45 may be adjacent the field oxide film 2, and that a connecting part between the first layer 10 and the second layer 16 of the control gate may be left without being in contact with control gates (not illustrated) partitioned by the field oxide film 2.

Then, as illustrated in FIG. 15, a PSG film 46 is formed on the entire one main surface of P type silicon semiconductor substrate 1. Subsequently, contact holes (not illustrated) are provided through the PSG film 46 for wiring using aluminum metal, whereby an n channel memory cell capable of being electrically written and erased is completely manufactured.

Figure 1B:
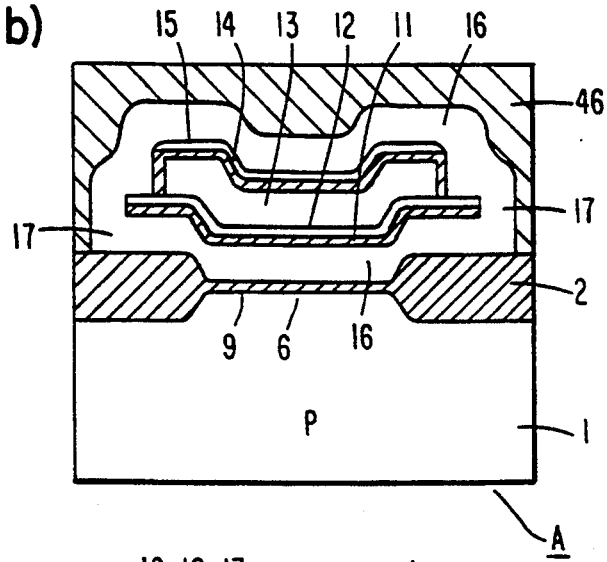
Figure 1C:
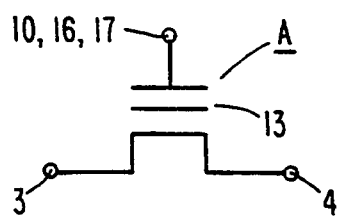
Figure 16:
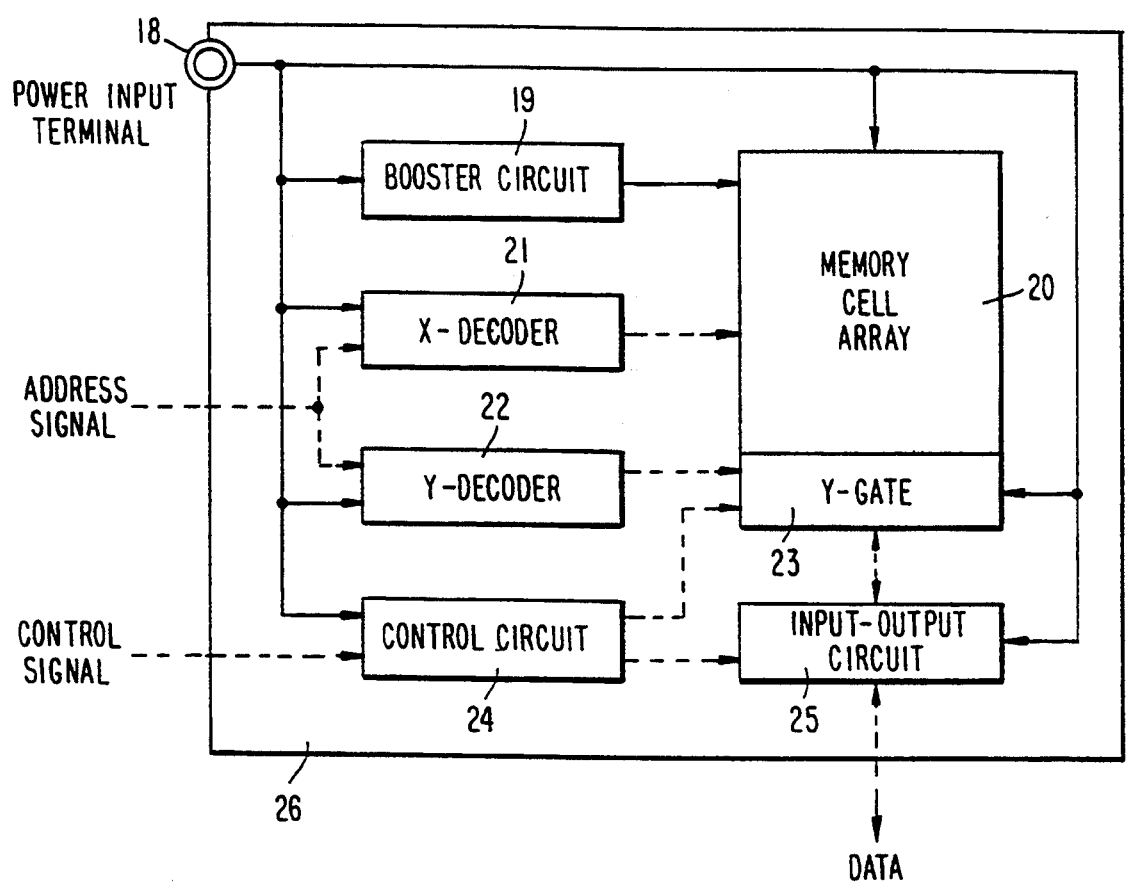
FIG. 16 is a block diagram showing an entire arrangement of the EEPROM as one embodiment in accordance with the invention.

FIG. 16 is a block diagram showing the entire arrangement of the EEPROM comprising the memory cells illustrated in FIG. 1. In the drawing, a reference numeral 19 indicates a booster circuit and numeral 20 indicates a memory cell array comprising a plurality of the memory cells of FIG. 1 arranged in a form of matrix. Both elements 19, 20 are formed on the mentioned semiconductor chip 26.

Figure 17:
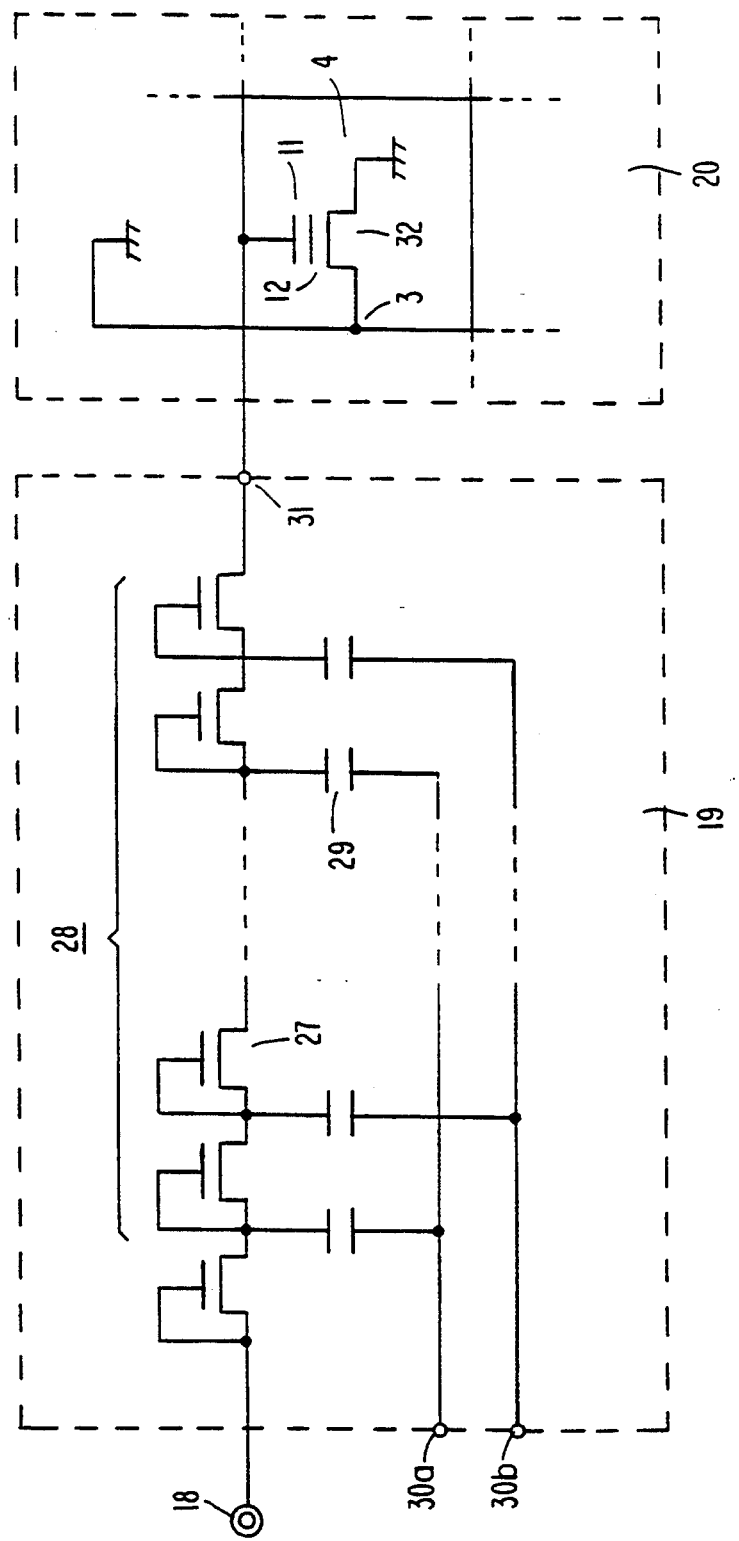
FIGS. 17 and 18 are circuit diagrams respectively showing an arrangement of a booster circuit incorporated in the EEPROM shown in FIG. 16.
Figure 18:
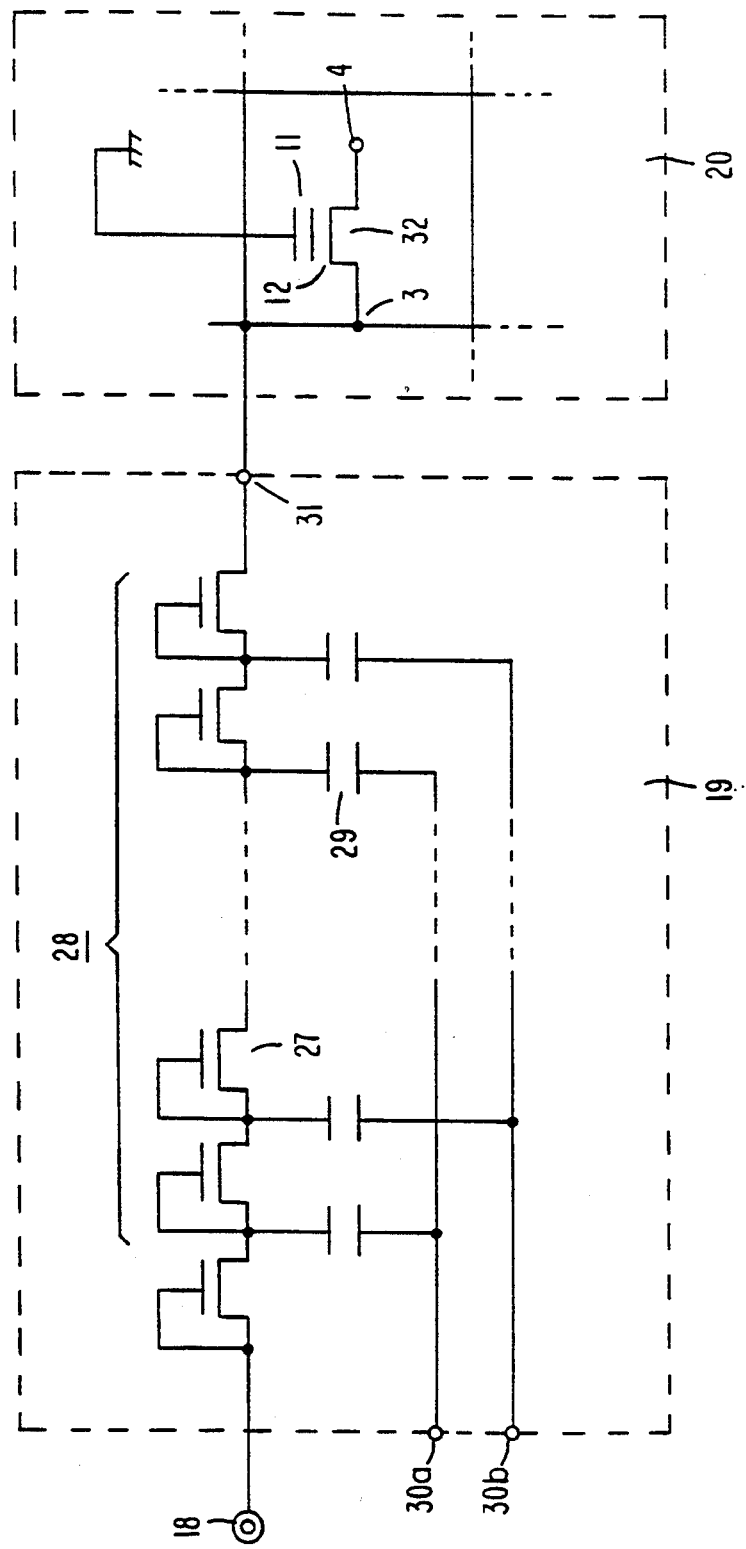

FIGS. 17 and 18 are equivalent circuit diagrams showing the EEPROM shown in FIG. 16, and in which FIG. 17 is a circuit diagram for writing data in a memory cell and FIG. 18 is a circuit diagram for erasing data from the memory cell. As shown in the drawings, MOS type transistors 27 are connected in series in a multistage manner thereby forming a charge pump 28. A capacitor 29 is connected to the MOS type transistors 27. In addition, numerals 30a, 30b indicate clocks $\phi$, $\bar{\phi}$ each generated in the mentioned semiconductor chip 26, numeral 31 indicates output of the mentioned booster circuit 19, and numeral 32 indicates the memory cell illustrated in FIG. 1.

In the internal circuit arranged as shown in FIGS. 17 and 18, a current supply capacitance charges the capacitor 29 which is capable of supplying current of $\mu A$ sequentially in order using the clocks $\bar{\phi}$ 30a and $\phi$ 30b, thereby boosting the power potential to be supplied to the power input terminal (VCC) 18 from 5V up to 15V. This potential and the current of about $\mu A$ are delivered to the output 31. As a result, the memory cell 20 is supplied with both high potential and current of about $\mu A$ from the booster circuit 19.

To be more specific, for writing data, the high potential boosted from the power potential (5V) by means of the booster circuit 19 is supplied to the control gates 10, 16, 17, whereby the potential $V_p$ of the floating gate 13 is 10V and, at the same time, the current of about $\mu A$ is supplied to the second channel region 7. In this manner, data writing by injection of electrons is achieved utilizing the tunnel current.

Since writing and erasing of data are performed by using the power potential (5V) alone supplied to the power input terminal (VCC) 18, it is no longer necessary to provide the high voltage power input terminal (VPP) to the semiconductor chip 26. Consequently, in the arrangement of a system on a printed board, not only design and manufacture of the peripheral portion of the power terminal is easy, but also rewriting of program or data while keeping them incorporated in the system is easy, resulting in a EEPROM which is easy to use.

Though n channel memory cells are formed on a P type silicon semiconductor substrate 1 in the foregoing embodiment, to enjoy the same advantages as above, it is also preferable that polarity is reversed from P type to N type so as to form P channel memory cells on a N type silicon semiconductor substrate.

Figure 19:
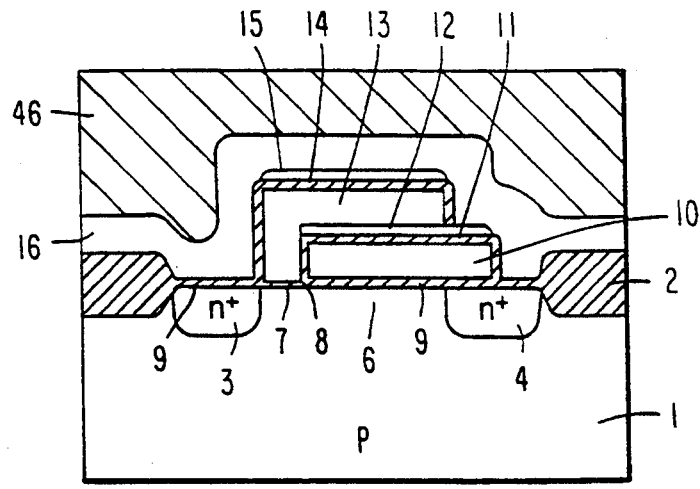
FIG. 19 is a structural sectional view showing another embodiment in accordance with the invention.

FIG. 19 shows a second embodiment in accordance with the present invention, and in which only the drain region is formed of n type drain 3 of high impurity concentration ($1 \times 10^{20}$ cm$^{-3}$). The same advantages as the foregoing first embodiment are insured also by this second embodiment.

What is claimed is:

1. A method for manufacturing a semiconductor memory device comprising the steps of:

forming a source region of second conduction type and a drain region of second conduction type in a semiconductor substrate of first conduction type so that said source region is separated from said drain region by first and second channel regions;

forming a first portion of a control gate, on a first insulating film, over said first channel region;

forming a floating gate on a second insulating film over said second channel region and on a first interlayer insulating film over said first portion of said control gate;

forming a second portion of said control gate over a surface of said floating gate on a second interlayer insulating film; and forming a third portion of said control gate, which connects one end of the second portion of said control gate to one end of said first portion of said control gate, orthogonal with one main surface of the semiconductor substrate.

* * * * *